(12) United States Patent
Boerstler et al.

(10) Patent No.: US 7,245,161 B2
(45) Date of Patent: Jul. 17, 2007

(54) APPARATUS AND METHOD FOR VERIFYING GLITCH-FREE OPERATION OF A MULTIPLEXER

(75) Inventors: David W. Boerstler, Round Rock, TX (US); Eskinder Hailu, Austin, TX (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/227,026

(22) Filed: Sep. 15, 2005

(65) Prior Publication Data

US 2007/0057697 A1   Mar. 15, 2007

(51) Int. Cl.
*H03K 17/00* (2006.01)
(52) U.S. Cl. .................... 327/99; 327/407
(58) Field of Classification Search ............. 327/407, 327/408, 99, 411, 295, 296
See application file for complete search history.

(56) References Cited

U.S. PATENT DOCUMENTS

| 4,229,699 | A | 10/1980 | Frissell |
| 4,853,653 | A | 8/1989 | Maher |
| 4,970,405 | A | 11/1990 | Hagiwara |
| 5,099,141 | A | 3/1992 | Utsunomiya |
| 5,122,677 | A | 6/1992 | Sato |
| 5,155,380 | A | 10/1992 | Hwang et al. |
| 5,231,636 | A | 7/1993 | Rasmussen |
| 5,315,181 | A | 5/1994 | Schowe |
| 5,357,146 | A | 10/1994 | Heimann |
| 5,740,064 | A * | 4/1998 | Witte et al. ............... 702/70 |
| 6,175,603 | B1 * | 1/2001 | Chapman et al. .......... 375/354 |
| 6,265,930 | B1 | 7/2001 | Walker et al. |
| 6,501,304 | B1 | 12/2002 | Boerstler et al. |
| 6,559,679 | B2 * | 5/2003 | Kim ......................... 326/93 |
| 6,600,355 | B1 * | 7/2003 | Nguyen .................... 327/298 |
| 6,671,341 | B1 * | 12/2003 | Kinget et al. ............. 375/373 |
| 6,809,556 | B1 * | 10/2004 | Bronfer et al. ............ 327/99 |

\* cited by examiner

*Primary Examiner*—Dinh T. Le
(74) *Attorney, Agent, or Firm*—Stephen J. Walder, Jr.; Diana R. Gerhardt

(57) ABSTRACT

An apparatus and method for verifying glitch-free operation of a multiplexer are provided. The apparatus includes a circuit having a plurality of flip-flop elements that receive as inputs the plurality of clock signals that are inputs to the multiplexer, and a corresponding synchronized output signal of a decoder generated based on control inputs to the decoder. The synchronized output signals from the decoder are used as trigger signals to the plurality of flip-flops. The flip-flops sample the clock signals based upon the trigger signals and provide outputs to a logic gate. The logic gate operates on the outputs from the flip-flops to generate an output signal indicative of whether glitch-free operation is verified or is not verified.

20 Claims, 2 Drawing Sheets

APPARATUS AND METHOD FOR VERIFYING GLITCH-FREE OPERATION OF A MULTIPLEXER

BACKGROUND OF THE INVENTION

1. Technical Field

The present invention relates generally to an improved circuit for providing glitch-free multiplexing. More specifically, the present invention is directed to an apparatus and method for verifying the glitch-free operation of a multiplexer.

2. Description of Related Art

There are a wide variety of circumstances where it is necessary or desirable to be able to select a clock signal from a plurality of clock signal sources. One such circumstance is in an application specific integrated circuit for use in switches or other packet-handling devices in packet-based data communication networks, although other circumstances also exist where such functionality is of use. In such circumstances it is often necessary to switch from one clock signal source to another in response to input signals.

In switching between two or more clocks in an integrated circuit, it is important that the switching be glitch-free. That is, transients that occur on a clock in a computer system that are not one of the usable edges may be mistaken by the integrated circuit as a valid clock edge and thus, may create timing problems or system failures. It is important to minimize the possibility of these transients affecting the timing of the integrated circuit. This is particularly of importance with high frequency circuits since these transients, or glitches, typically result in large high frequency spurious outputs which can subsequently mix and result in undesirable tones at the input/output of these circuits.

If the two or more clocks are synchronous, which means they are derived from the same reference source, providing glitch-free switching is simpler to achieve. However, if the two or more clocks are not synchronous, glitch-free switching is more difficult to achieve. In many integrated circuits, there are times when it may be advantageous to switch between asynchronous clocks for the system clock while providing glitch-free switching.

In order to achieve such glitch-free switching many different types of glitch-free multiplexer architectures have been devised. Examples of such glitch-free multiplexers are provided in U.S. Pat. Nos. 4,229,699; 4,853,653; 4,970,405; 5,099,141; 5,122,677; 5,155,380; 5,231,636; 5,315,181; 5,357,146; 6,265,930; and 6,501,304. While these various architectures provide solutions to the problem of glitches in switching between clock signals, they do not provide any mechanism for verifying that the glitch-free multiplexers are actually operating in a glitch-free manner.

To the contrary, the only way in which one can observe glitch-free operation of these and other known glitch-free multiplexers is via observation of the multiplexer output when a clock select signal is changed from one clock mode to another. This can be a very tedious process for a number of reasons. First, the observer must carefully time the measurement apparatus to capture the output of the multiplexer at the instant when the clock select transition occurs. Second, in the case of high frequency clocks being multiplexed, the observer might not be able to accurately observe output transitions due to bandwidth limitations. Third, the observer will have to observe thousands of transitions in order to safely conclude the glitch-free operation of a glitch-free multiplexer.

SUMMARY OF THE INVENTION

In view of the above, it would be beneficial to have an apparatus and method for verifying the glitch-free operation of a multiplexer in an autonomous and continuous manner. Moreover, it would be beneficial to have an apparatus and method for verifying glitch-free operation in which the glitch-free operation is verified with each switching operation between clock signals.

The present invention provides an apparatus and method for verifying glitch-free operation of a multiplexer. The mechanisms of the present invention include a circuit having a plurality of flip-flop elements that receive as inputs the plurality of clock signals and a corresponding synchronized output signal of a decoder generated based on control inputs to the decoder. The synchronized output signals from the decoder are used as trigger signals to the plurality of flip-flops. The outputs of the plurality of flip-flops are provided to a logic gate which outputs a signal indicative of whether glitch-free operation is verified or is not verified.

In an exemplary embodiment of the present invention, the flip-flops are edge triggered flip-flops that are used to sample the clock signals. The edge triggered flip-flops operate on both rising and falling edges of the trigger signals, i.e. the synchronized output signal from the decoder. When the clock signals are sampled, all of the clock signals are expected to be at the same state, either all of the clock signals are at a high signal state or all of the clock signals are at a low signal state. If all of the clock signals are at the same state, then glitch free operation is verified. If all of the clock signals are not at the same state, e.g., one or more of the clock signals are at a low signal state while others are at a high signal state, then a glitch is determined to have been present and an appropriate signal is output to identify the multiplexer as having not been glitch-free.

In one exemplary embodiment, the glitch-free multiplexer is designed such that multiplexing takes place only on the falling edge of the clock signals. In this exemplary embodiment, every time the triggering signals make a transition, the clock signals are sampled in the flip-flops. If the multiplexing is glitch-free, then all the sampled outputs of the flip-flops will be low for every transition in the select signals. For this exemplary embodiment, the logic gate is a NOR gate. If no glitches are present, then the inputs to the NOR gate will always be low and, as a result, the output of the NOR gate will be high indicating glitch-free operation. If a glitch is present, one or more of the inputs to the NOR gate will be high and, as a result, the output of the NOR gate will be low indicating non-glitch-free operation.

In another exemplary embodiment of the present invention, the glitch-free multiplexer is designed such that multiplexing takes place only on the rising edge of the clock signals. In this exemplary embodiment, every time the triggering signals make a transition, the clock signals are sampled in the flip-flops. If the multiplexing is glitch-free, then all the sampled outputs of the flip-flops will be high for every transition in the select signals. For this exemplary embodiment, the logic gate is an AND gate. If no glitches are present, then the inputs to the AND gate will always be high and, as a result, the output of the AND gate will be high indicating glitch-free operation. If a glitch is present, one or more of the inputs to the AND gate will be low and, as a result, the output of the AND gate will be low indicating non-glitch-free operation.

In one exemplary embodiment of the present invention, a glitch-free multiplexer is provided that comprises a multiplexer and a glitch-free verification device coupled to the multiplexer. The multiplexer may receive, as input, a plurality of clock signals and a plurality of corresponding trigger signals. The glitch-free verification device may receive the plurality of clock signals and the plurality of corresponding trigger signals and may determine if the multiplexer is operating in a glitch-free manner based on the plurality of clock signals and the plurality of corresponding trigger signals.

The glitch-free verification device may comprise a plurality of flip-flops. Each flip-flop in the plurality of flip flops may receive, as input, a different clock signal of the plurality of clock signals. The glitch-free verification device may further comprise a logic gate coupled to the plurality of flip-flops, each flip-flop in the plurality of flip-flops sampling a corresponding clock signal and providing the sampled clock signal to the logic gate. The logic gate may operate on the sampled clock signals from the plurality of flip-flops to verify glitch-free operation of the multiplexer.

Each flip-flop in the plurality of flip-flops may receive, as input, a different trigger signal of the plurality of corresponding trigger signals and may sample their corresponding clock signals when the trigger signal transitions from one state to another. The flip-flops in the plurality of flip-flops may be edge triggered flip-flops.

The logic gate may be a NOR gate such that if any of the sampled clock signals from the plurality of flip-flops is at a high state, the NOR gate outputs a signal indicative of non-glitch-free operation. Alternatively, the logic gate may be an AND gate such that if any of the sampled clock signals from the plurality of flip-flops is at a low state, the AND gate outputs a signal indicative of non-glitch-free operation.

The glitch-free multiplexer may further comprise a decoder and a synchronizer coupled to the decoder, the glitch free verification device, and the multiplexer. The trigger signals may be input to the plurality of flip-flops from the synchronizer that synchronizes output signals from the decoder with the clock signals.

In another exemplary embodiment of the present invention, a data processing device is provided that comprises a circuit, a plurality of clock signal sources which provide clock signal inputs to the circuit, and a glitch free verification device coupled to the circuit. The glitch free verification device may include a plurality of flip-flops and a logic gate coupled to the plurality of flip-flops in a similar manner as describe previously. The data processing device may be one of an integrated circuit chip, a multi-chip package, a motherboard, a gaming console, a handheld computing device, portable computing device, or non-portable computing device.

In a further embodiment of the present invention, a method is provided for verifying glitch-free operation of a glitch-free multiplexer. The method may comprise receiving a plurality of input clock signals, the input clock signals being inputs to the glitch-free multiplexer. A plurality of trigger signals may be received, each trigger signal corresponding to a respective one of the plurality of input clock signals. The plurality of input clock signals may be sampled based on their corresponding trigger signals in the plurality of trigger signals. A determination may be made as to whether glitch-free operation of the glitch-free multiplexer is present based on the sampled input clock signals.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENTS

Figure 1:
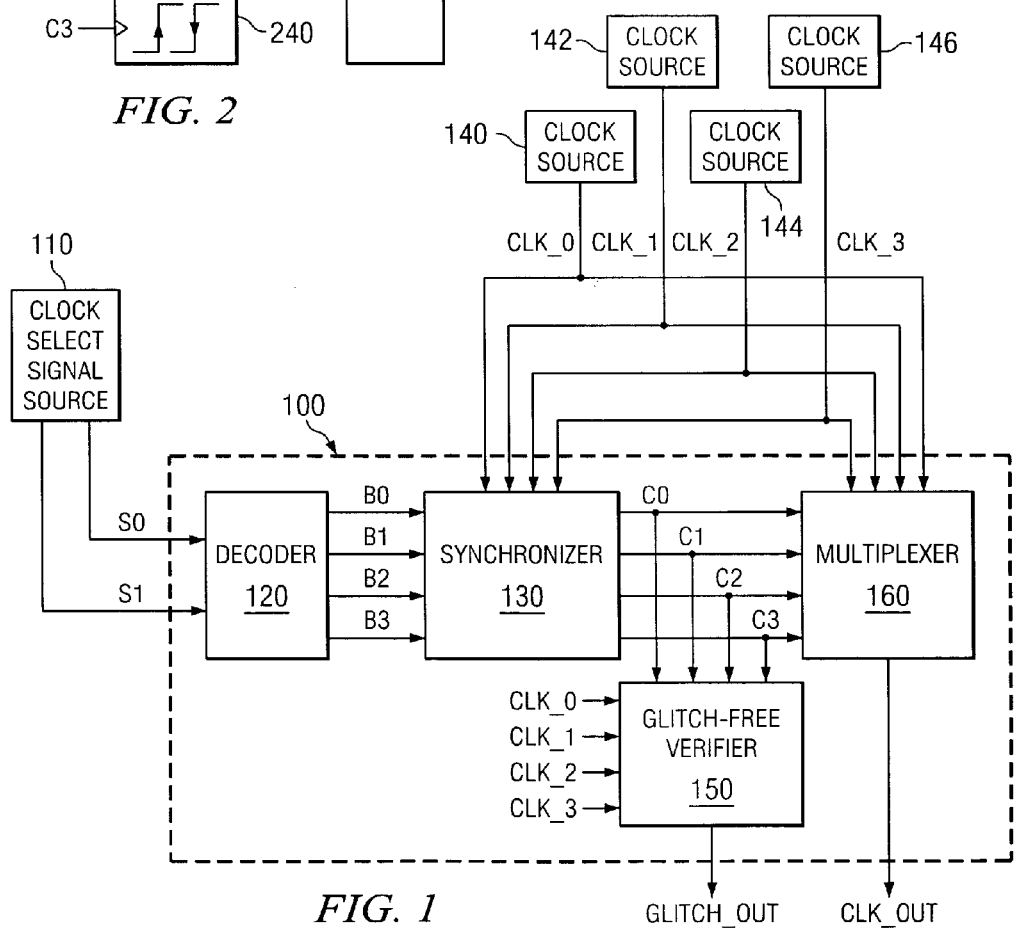
FIG. 1 is an exemplary block diagram of a glitch-free multiplexer in accordance with one exemplary embodiment of the present invention.

FIG. 1 is an exemplary block diagram of a glitch-free multiplexer in accordance with one exemplary embodiment of the present invention. It should be appreciated that the circuit illustrated in the block diagram of FIG. 1 may be part of an integrated circuit device or chip, such as an application specific integrated circuit (ASIC) or the like. The various possible uses of the glitch-free multiplexer in circuits, such as an ASIC, will be readily apparent to those of ordinary skill in the art in view of the present description.

As shown in FIG. 1, the glitch-free multiplexer 100 includes a clock select signal source 110, a decoder 120, a synchronizer 130, a plurality of clock sources 140–146, a glitch-free verifier 150, and a multiplexer 160. Clock sources 140–146 provide different clock signals to the glitch-free multiplexer 100 which the glitch-free multiplexer 100 may switch between in response to commands to switch the clock signal of the integrated circuit. Control inputs S0 and S1, which are used to select one of the clock signals provided by clock sources 140–146, are provided to the glitch-free multiplexer 100 from clock select signal source 110. The decoder 120 decodes the control inputs S0 and S1 and generates asynchronous outputs that are synchronized by the synchronizer 130 with the clock signals from clock sources 140–146. The glitch-free verifier 150 verifies glitch-free operation of the multiplexer 160 based on the synchronized output from synchronizer 130 and the clock signals obtained from clock sources 140–146. The multiplexer 160 multiplexes the clock signals from clock sources 140–146 and outputs one of the clock signals based on the synchronized output from synchronizer 130.

In the depicted exemplary embodiment, the multiplexer 160 is a multiplexer having four clock signal inputs, CLK_0, CLK_1, CLK_2 and CLK_3. The multiplexer 160 selects one of the four clock input signals as a clock output signal CLK_OUT based on control inputs S0 and S1 provided to the glitch-free multiplexer 100 by clock select signal source 110. For example, if S0=0 and S1=0, the multiplexer 160 may select clock input signal CLK_0 as the clock output signal CLK_OUT. Similarly, if S0=0 and S1=1, the multiplexer may select clock input signal CLK_1 as the clock output signal CLK_OUT. The other two input clock signals may be selected based on the other possible combinations of data values for S0 and S1. It should be noted that the inputs to the glitch-free multiplexer 100, i.e. S0, S1, CLK_0, CLK_1, CLK_2, and CLK_3, are all asynchronous with respect to one another.

The control inputs S0 and S1 are input to decoder 120 which generates four outputs B0, B1, B2 and B3. The output signals B0–B3 are asynchronous with each other as well as with clock signals CLK_0–CLK_3. The decoding performed by the decoder 120 reduces the number of input bits that are used to perform the select in the multiplexer 160. For example, two input select signals, after going through the decoder 120, will be able to select one of four inputs of the multiplexer 160.

The output signals B0–B3 of the decoder 120 are input to synchronizer 130. The synchronizer 130 synchronizes the B0–B3 output signals with respective ones of clock signals CLK_0–CLK_3. Thus, for example, output signal B0 is synchronized with clock signal CLK_0, output signal B1 is synchronized with clock signal CLK_1, output signal B2 is synchronized with clock signal CLK_2, and output signal B3 is synchronized with clock signal CLK_3. These synchronized outputs C0, C1, C2 and C3 are trigger signals that drive the multiplexer 160 that will select one of the four clock inputs CLK_0–CLK3 based on these trigger signals. For example, when C0 is high, CLK_0 is selected, when C1 is high, CLK_1 is selected, etc. Only one of C0–C3 may be high at any one time.

Synchronization of the output signals B0–B3 with clock signals CLK_0–CLK_3 implies creating a predictable timing relationship between the clock signals CLK_0–CLK_3 and the resulting synchronized output signals C0–C3. For example, synchronized output signals C0–C3 may be allowed to change from low to high, i.e. 0 to 1, or from high to low, i.e. 1 to 0, only on a falling edge transition of clock signals CLK_0–CLK_3, respectively. Alternatively, synchronized output signals C0–C3 may be allowed to change from low to high or high to low only on a rising edge transition of the clock signals CLK_0–CLK_3.

By sampling the clock signals CLK_0–CLK_3 at the point where C0–C1 make a transition, glitch-free operation of the multiplexer 160 may be verified. In other words, when the trigger signals transition, all of the clock signals also should transition and all of the clock signals should transition to the same state, either high or low. If any of the clock signals do not transition to the expected same state, either high or low, then a glitch may be determined to have occurred.

The glitch-free verifier 150 of the present invention provides a circuit for performing such verification of glitch-free operation of the multiplexer 160 based on the clock signals CLK_0–CLK_3 and the trigger signals C0–C3. The glitch-free verifier 150 receives these clock and trigger signals as inputs, samples the clock signals when the trigger signals transition, and determines if glitch-free operation of the multiplexer 160 is verified based on the sampled clock signals. The glitch-free verifier 150 then generates an output signal, GLITCH_OUT, which identifies whether or not the multiplexer 160 is operating in a glitch-free manner. In one exemplary embodiment, the GLITCH_OUT output signal is a DC signal indicating pass/fail.

Figure 2:
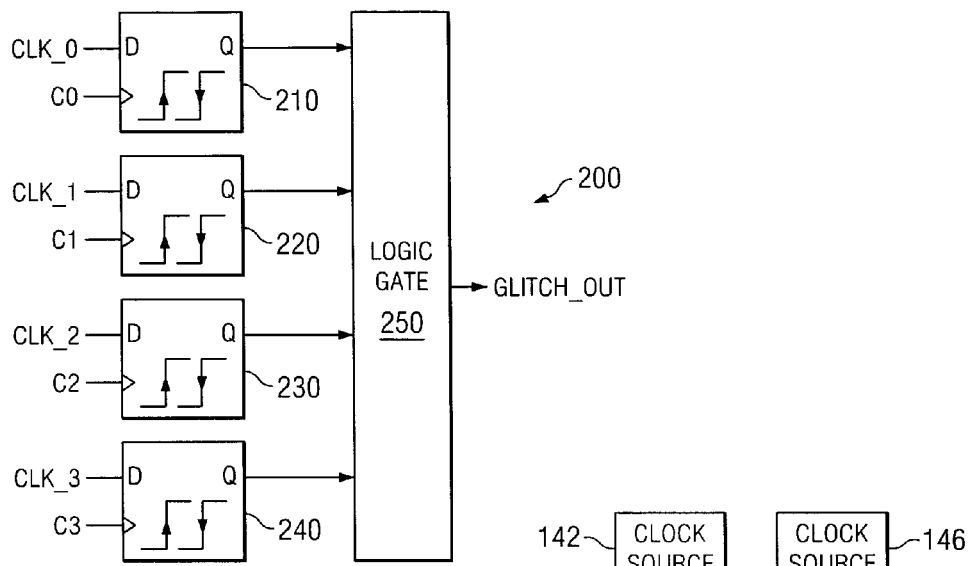
FIG. 2 is an exemplary block diagram of a glitch-free verification circuit in accordance with one exemplary embodiment of the present invention.

FIG. 2 is an exemplary block diagram of a glitch-free verification circuit in accordance with one exemplary embodiment of the present invention. As shown in FIG. 2, the glitch-free verification circuit 200, which may be used to provide glitch-free verifier 150 in FIG. 1, for example, includes a plurality of flip-flops 210–240 and a logic gate 250. The flip-flops 210–240, in the depicted exemplary embodiment, are edge triggered flip-flops which operate on both the rising and falling edges of the trigger signals C0–C3. The edge triggered flip-flops are used to sample the clock signals CLK_0–CLK3 when the trigger signals C0–C3 transition, i.e. at the edge of the trigger signals C0–C3.

As shown in FIG. 2, each edge triggered flip-flop receives a clock signal and its corresponding synchronized trigger signal. For example, edge triggered flip-flop 210 receives clock signal CLK_0 and trigger signal C0, edge triggered flip-flop 220 receives clock signal CLK_1 and trigger signal C1, edge triggered flip-flop 230 receives clock signal CLK_2 and trigger signal C2, and edge triggered flip-flop 240 receives clock signal CLK_3 and trigger signal C3. When the trigger signals C0–C3 transition from either low to high or high to low, the clock signal input is output by the edge triggered flip-flops 210–240 to logic gate 250. Logic gate 250 performs the operation of determining if the outputs of the edge triggered flip-flops 210–240 are all low, or in an alternative embodiment, all high. If so, then glitch-free operation of the multiplexer is verified. That is, the clocks are all at the same state when the clocks are sampled in response to the synchronized trigger signals and thus, none of the clock signals have transitioned earlier or later than the other clock signals, i.e. there is no glitch. If any of the edge triggered flip-flops 210–240 outputs a signal having a state that is different from the expected state, i.e. low or high, then glitch-free operation of the multiplexer is not verified.

In one exemplary embodiment, the glitch-free multiplexer is designed such that multiplexing takes place only on the falling edge of the clock signals CLK_0–CLK_3. Triggering signals C0–C3 are synchronized with the clock signals CLK_0–CLK3 such that the triggering signals are allowed to transition only at the falling edge of the clock signals CLK_0–CLK_3. In this exemplary embodiment, every time the triggering signals C0–C1 make a transition, the clock signals CLK_0–CLK_3 are sampled in the edge triggered flip-flops 210–240. If the multiplexing is glitch-free, then all the sampled outputs of the edge triggered flip-flops 210–240 will be low for every transition in the trigger signals C0–C3, i.e. the transition of the trigger signals C0–C3 is synchronized with the falling edge of the clock signals CLK_0–CLK3. If the multiplexing experiences a glitch, then one or more of the sampled outputs of the edge triggered flip-flops 210–240 will be high for a transition in the trigger signals C0–C3, i.e. the transition of one or more of the trigger signals C0–C3 is not synchronized with the falling edge of the corresponding clock signal CLK_0–CLK_3 due to a glitch having occurred.

For this exemplary embodiment, the logic gate 250 is a NOR gate. If no glitches are present, then the inputs to the NOR gate will always be low and, as a result, the output of the NOR gate will be high indicating glitch-free operation. If a glitch is present, one or more of the inputs to the NOR gate will be high and, as a result, the output of the NOR gate will be low indicating non-glitch-free operation.

In another exemplary embodiment of the present invention, the glitch-free multiplexer is designed such that multiplexing takes place only on the rising edge of the clock signals CLK_0–CLK_3. In this exemplary embodiment, every time the triggering signals C0–C3 make a transition, the clock signals CLK_0–CLK_3 are sampled in the edge triggered flip-flops 210–240. If the multiplexing is glitch-free, then all the sampled outputs of the edge triggered flip-flops 210–240 will be high for every transition in the trigger signals C0–C3.

For this exemplary embodiment, the logic gate 250 is an AND gate. If no glitches are present, then the inputs to the AND gate will always be high and, as a result, the output of the AND gate will be high indicating glitch-free operation. If a glitch is present, one or more of the inputs to the AND gate will be low and, as a result, the output of the AND gate will be low indicating non-glitch-free operation.

It should be noted that while the depicted example of the glitch-free multiplexer in FIG. 1 and the glitch-free verification circuit in FIG. 2 are shown with four clock signal inputs, two clock select signal inputs, and four trigger signals, and thus, four edge triggered flip-flops, the present invention is not limited to such. Rather, the mechanisms of the present invention are scalable to any number of input clock signals, and triggering signals. The only requirement is that the number of clock select signals, triggering signals, and thus, edge triggered flip-flops, needs to be sufficient for the number of input clock signals being multiplexed.

Figure 3:
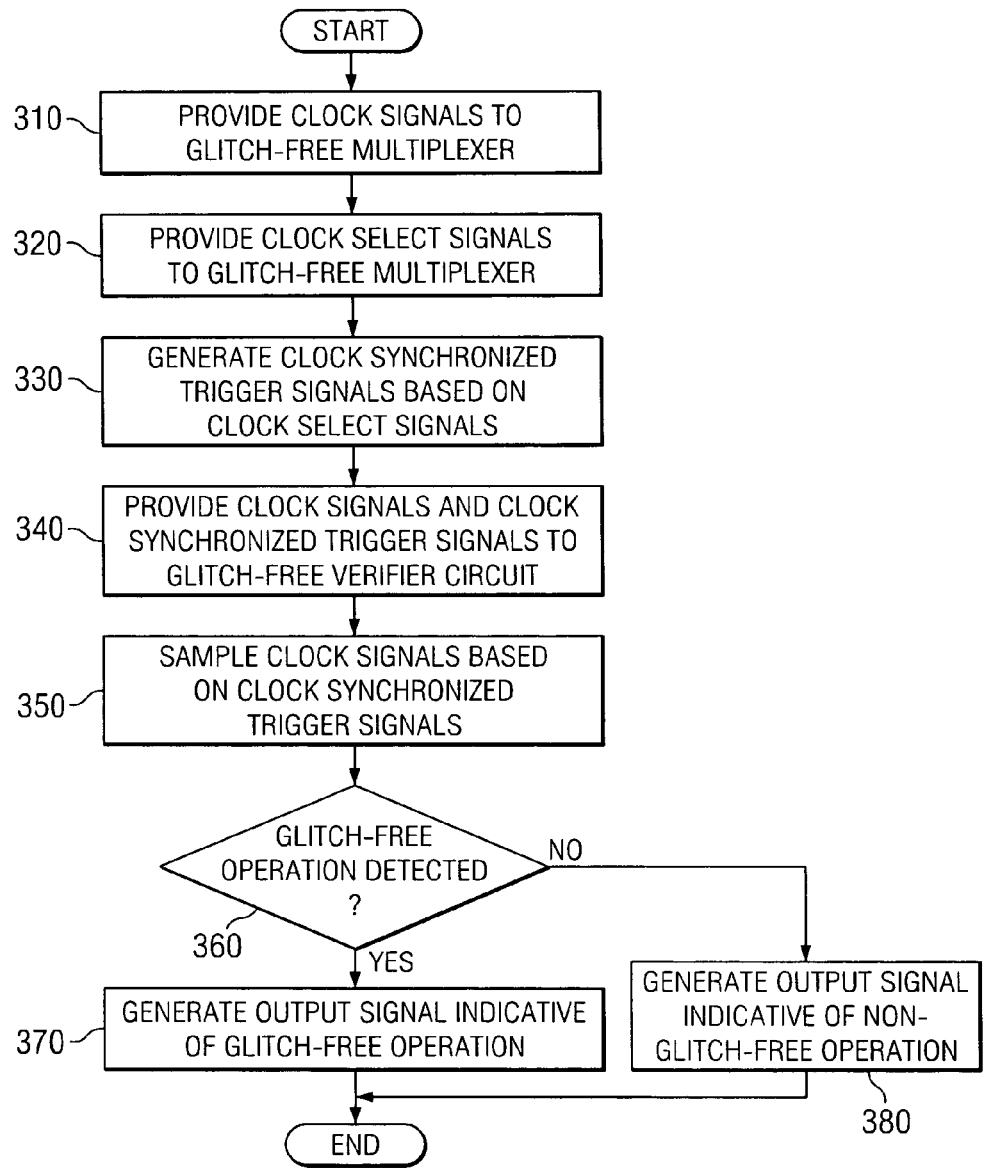
FIG. 3 is a flowchart outlining an exemplary operation of the present invention when verifying glitch-free operation of a multiplexer.

FIG. 3 is a flowchart outlining an exemplary operation of the present invention when verifying glitch-free operation of a multiplexer. As shown in FIG. 3, the operation starts by providing a plurality of clock signals to a glitch-free multiplexer of the present invention (step 310). Clock select signals are provided to the glitch-free multiplexer (step 320) and clock synchronized trigger signals are generated based on the clock select signals (step 330). The clock synchronized trigger signals and the clock signals are provided to a glitch-free verifier circuit of the glitch-free multiplexer (step 340). The glitch-free verifier circuit samples the clock signals when the trigger signals transition (step 350).

A determination is made as to whether glitch-free operation is verified based on the sampled clock signals (step 360). If glitch-free operation is verified, a signal indicative of glitch-free operation is output (step 370). If glitch-free operation is not verified, a signal indicative of non-glitch-free operation is output (step 380). The operation then terminates. It should be appreciated that this process may be repeated periodically or continuously. For example, the operation may be performed in response to a command to verify glitch free operation being received. Alternatively the operation may be performed with every clock switch performed by the circuit.

Thus, the present invention provides a glitch-free verification device and glitch-free multiplexer in which the glitch-free operation of the multiplexer may be autonomously verified with each clock switching operation of the glitch-free multiplexer. The glitch-free verification device is a robust device that allows the monitoring of the glitch-free multiplexer's performance under any operating condition. Moreover, because the glitch-free verification device, in one exemplary embodiment, outputs a DC pass/fail signal, the glitch-free verification device can be easily used in testing and manufacturing environments for diagnostic purposes. That is, any DC meter may be used in such environments to measure the value of the DC output of the glitch-free verification device.

While the above embodiments are directed to verifying glitch-free operation of a glitch-free multiplexer, the present invention is not limited to such. Rather, it should be appreciated that the glitch-free verification apparatus of the present invention may be applied to other circuits in which glitch-free operation is important. Thus, any circuitry in which glitch-free operation would be helpful to verify may have the glitch-free verification apparatus of the present invention integrated into the circuitry.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to gaming consoles, handheld or portable computing devices, and other advanced non-portable computer products having a display, a keyboard or other input device, and a central processor.

Figure 4:
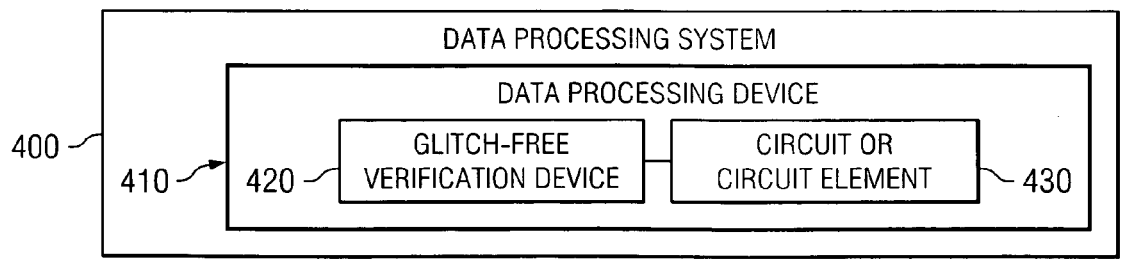
FIG. 4 is an exemplary block diagram illustrating a data processing device or system in which the glitch-free verification circuit of the present invention may be implemented.

FIG. 4 is an exemplary block diagram illustrating a data processing device in which the glitch-free verification circuit of the present invention may be implemented. As shown in FIG. 4, the glitch-free verification device 420 is provided on or in a data processing device 410 in association with a circuit or circuit element 430 whose glitch-free operation is to be verified by the glitch-free verification device 420. It should be noted that while the data processing device 410 is illustrated as having a single glitch-free verification device 420 coupled to the circuit 430, the present invention is not limited to such. Rather, multiple instances of various circuits or circuit elements 430 whose glitch-free operation is to be verified may be provided in the data processing device 410 along with a corresponding glitch-free verification device 420 in accordance with the present invention.

As mentioned above, the data processing device 410 may be any of a number of different types of data processing devices. Such data processing devices include, but are not limited to, integrated circuit chips, multi-chip packages, motherboards, and the like. The data processing device 410 may be part of a larger data processing system or device 400. This larger data processing system or device 400 may be any type of device utilizing a data processing device 410 ranging from toys and other low-end applications to gaming consoles, handheld or portable computing devices, and other advanced non-portable computing devices, such as desktop computers, servers, or the like.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A data processing device, comprising:
   a circuit;
   a plurality of clock signal sources which provide clock signal inputs to the circuit; and
   a glitch free verification device coupled to the circuit, wherein the glitch free verification device includes:
      a plurality of flip-flops, wherein each flip-flop in the plurality of flip flops receives, as input, a different clock signal from a different one of the plurality of clock signal sources; and
      a logic gate coupled to the plurality of flip-flops, wherein each flip-flop in the plurality of flip-flops samples a corresponding clock signal and provides the sampled clock signal to the logic gate, and wherein the logic gate operates on the sampled clock signals from the plurality of flip-flops to verify glitch-free operation of the circuit.

2. The data processing device of claim 1, wherein each flip-flop in the plurality of flip-flops receives, as input, a different trigger signal, and wherein the flip-flops in the plurality of flip-flops sample their corresponding clock signals when the trigger signal transitions from one state to another.

3. The data processing device of claim 1, wherein the data processing device is one of an integrated circuit chip, a multi-chip package, a motherboard, a gaming console, a handheld computing device, portable computing device, or non-portable computing device.

4. The data processing device of claim 1, wherein the logic gate is a NOR gate, and wherein if any of the sampled clock signals from the plurality of flip-flops is at a high state, the NOR gate outputs a signal indicative of non-glitch-free operation.

5. The data processing device of claim 1, wherein the logic gate is an AND gate, and wherein if any of the sampled clock signals from the plurality of flip-flops is at a low state, the AND gate outputs a signal indicative of non-glitch-free operation.

6. The data processing device of claim 2, wherein the trigger signals are input to the plurality of flip-flops from a synchronizer that synchronizes output signals from a decoder with the clock signals.

7. The data processing device of claim 6, wherein the decoder receives at least one clock select signal input from a clock select signal source and generates a plurality of output signals that are provided to the synchronizer as inputs.

8. The data processing device of claim 1, wherein the circuit is a glitch-free multiplexer.

9. The data processing device of claim 1, wherein the logic gate outputs a DC signal indicative of either glitch-free or non-glitch-free operation of the circuit.

10. The data processing device of claim 2, wherein each trigger signal is synchronized to a corresponding clock signal such that the trigger signal transitions only on a falling edge of the corresponding clock signal.

11. The data processing device of claim 2, wherein each trigger signal is synchronized to a corresponding clock signal such that the trigger signal transitions only on a rising edge of the corresponding clock signal.

12. A glitch-free multiplexer, comprising:
    a multiplexer; and
    a glitch-free verification device coupled to the multiplexer, wherein:
       the multiplexer receives, as input, a plurality of clock signals and a plurality of corresponding trigger signals,
       the glitch-free verification device receives the plurality of clock signals and the plurality of corresponding trigger signals, and
       the glitch-free verification device determines if the multiplexer is operating in a glitch-free manner based on the plurality of clock signals and the plurality of corresponding trigger signals.

13. The glitch-free multiplexer of claim 12, wherein the glitch-free verification device comprises:
    a plurality of flip-flops, wherein each flip-flop in the plurality of flip flops receives, as input, a different clock signal of the plurality of clock signals; and
    a logic gate coupled to the plurality of flip-flops, wherein each flip-flop in the plurality of flip-flops samples a corresponding clock signal and provides the sampled clock signal to the logic gate, and wherein the logic gate operates on the sampled clock signals from the plurality of flip-flops to verify glitch-free operation of the multiplexer.

14. The glitch-free multiplexer of claim 13, wherein each flip-flop in the plurality of flip-flops receives, as input, a different trigger signal of the plurality of corresponding trigger signals, and wherein the flip-flops in the plurality of flip-flops sample their corresponding clock signals when the trigger signal transitions from one state to another.

15. The glitch-free multiplexer of claim 13, wherein the flip-flops in the plurality of flip-flops are edge triggered flip-flops.

16. The glitch-free multiplexer of claim 13, wherein the logic gate is a NOR gate, and wherein if any of the sampled clock signals from the plurality of flip-flops is at a high state, the NOR gate outputs a signal indicative of non-glitch-free operation.

17. The glitch-free multiplexer of claim 13, wherein the logic gate is an AND gate, and wherein if any of the sampled clock signals from the plurality of flip-flops is at a low state, the AND gate outputs a signal indicative of non-glitch-free operation.

18. The glitch-free multiplexer of claim 12, further comprising:
    a decoder; and
    a synchronizer coupled to the decoder, the glitch free verification device, and the multiplexer.

19. The glitch-free multiplexer of claim 13, further comprising:
    a decoder; and
    a synchronizer coupled to the decoder, the glitch free verification device, and the multiplexer, wherein the trigger signals are input to the plurality of flip-flops from the synchronizer that synchronizes output signals from the decoder with the clock signals.

20. A method of verifying glitch-free operation of a glitch-free multiplexer, comprising:
    receiving a plurality of input clock signals, wherein the input clock signals are inputs to the glitch-free multiplexer;
    receiving a plurality of trigger signals, each trigger signal corresponding to a respective one of the plurality of input clock signals;
    sampling the plurality of input clock signals based on their corresponding trigger signals in the plurality of trigger signals; and
    determining if glitch-free operation of the glitch-free multiplexer is present based on the sampled input clock signals.

* * * * *